(12) United States Patent
Sun et al.

(10) Patent No.: US 11,948,845 B2
(45) Date of Patent: Apr. 2, 2024

(54) DEVICE AND SYSTEM FOR TESTING FLATNESS

(71) Applicant: BOE Technology Group Co., Ltd., Beijing (CN)

(72) Inventors: Shaodong Sun, Beijing (CN); Haoran Gao, Beijing (CN); Guangcai Yuan, Beijing (CN); Lilei Zhang, Beijing (CN); Wenyue Fu, Beijing (CN); Li Li, Beijing (CN); Hanbo Zheng, Beijing (CN); Shuqi Liu, Beijing (CN); Qi Qi, Beijing (CN); Junwei Yan, Beijing (CN); Pingkuan Gu, Beijing (CN); Lina Jing, Beijing (CN); Yan Chen, Beijing (CN); Yimin Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 442 days.

(21) Appl. No.: 17/483,613

(22) Filed: Sep. 23, 2021

(65) Prior Publication Data
US 2022/0238391 A1   Jul. 28, 2022

(30) Foreign Application Priority Data

Jan. 27, 2021   (CN) .......................... 202120233157.4

(51) Int. Cl.
*G01B 11/30*   (2006.01)
*H01L 21/66*   (2006.01)
*H01L 21/02*   (2006.01)

(52) U.S. Cl.
CPC ............ *H01L 22/12* (2013.01); *G01B 11/306* (2013.01); *H01L 21/02422* (2013.01)

(58) Field of Classification Search
CPC .............................. H01L 22/12; G01B 11/306
(Continued)

(56) References Cited

U.S. PATENT DOCUMENTS

| | | | | | |
|---|---|---|---|---|---|
| 5,270,560 | A | * | 12/1993 | Cheng ................. | G01B 11/255 356/613 |
| 5,465,153 | A | * | 11/1995 | Ladewski ............ | G01B 11/303 356/243.4 |

(Continued)

*Primary Examiner* — George B Bennett
(74) *Attorney, Agent, or Firm* — IPro, PLLC

(57) ABSTRACT

The present disclosure relates to a device and a system for testing flatness. The device for testing flatness includes a base, a testing platform, and a ranging sensor. The testing platform is assembled on the base. The testing platform includes a supporting structure. The supporting structure is disposed on the side of the testing platform away from the base and is used to support a to-be-tested board. The structure matches the structure of the to-be-tested board. The ranging sensor is disposed on the side of the testing platform away from the base. After the to-be-tested board is placed on the testing platform, the ranging sensor is used to test distances between a number N of to-be-tested positions on the to-be-tested board and the ranging sensor, to obtain N pieces of distance information, and the N pieces of distance information are used to determine the flatness of the to-be-tested board, where N is an integer greater than 2. According to the embodiments of the present disclosure, the flatness of the glass substrate can be tested to improve the manufacturing process to reduce the flatness of the glass substrate, and avoid the problem that the glass substrate is easily broken when entering the subsequent process equipment and the process equipment is down.

18 Claims, 8 Drawing Sheets

(58) Field of Classification Search
USPC .......................................................... 33/533
See application file for complete search history.

(56) References Cited

U.S. PATENT DOCUMENTS

| | | | | |
|---|---|---|---|---|
| 5,760,392 | A * | 6/1998 | Hisamoto | G01B 5/0014 |
| | | | | 250/237 G |
| 6,212,786 | B1 * | 4/2001 | Naoi | B25B 11/005 |
| | | | | 33/573 |
| 8,605,277 | B2 * | 12/2013 | Yamada | G01N 21/95684 |
| | | | | 356/237.1 |
| 9,488,473 | B2 * | 11/2016 | Dorel | G01B 11/306 |
| 11,481,887 | B2 * | 10/2022 | Cui | G06F 30/398 |
| 2001/0012388 | A1 * | 8/2001 | Muller | B21B 37/44 |
| | | | | 382/141 |
| 2009/0042481 | A1 * | 2/2009 | Mavliev | G01B 11/306 |
| | | | | 356/600 |
| 2020/0266092 | A1 * | 8/2020 | Grejda | H01L 21/67742 |
| 2022/0307991 | A1 * | 9/2022 | Wang | G01N 21/8851 |
| 2023/0030272 | A1 * | 2/2023 | Yamauchi | H01L 21/67248 |
| 2023/0154774 | A1 * | 5/2023 | Sakamoto | B23K 26/53 |
| | | | | 438/7 |

\* cited by examiner

DEVICE AND SYSTEM FOR TESTING FLATNESS

CROSS-REFERENCES TO RELATED APPLICATIONS

This patent application claims the priority of the Chinese patent application No. 2021202331574 filed on Jan. 27, 2021, and entitled "DEVICE AND SYSTEM FOR TESTING FLATNESS", the entire content of which is incorporated herein by reference.

TECHNICAL FIELD

The present disclosure relate to the technical field of flatness testing, in particular to a device and a system for testing flatness.

BACKGROUND

In related art, as flowing in a process, a glass substrate may undergo various processing processes such as film formation, etching, heating, cooling, and so on, and different degrees of stress are formed between film layers in a glass substrate. The glass substrate may deform due to excessive stress between the layers. When entering the subsequent process equipment, the glass substrate is likely to break and cause the process equipment to crash.

Therefore, how to test flatness of a glass substrate in order to improve the manufacturing process to reduce the flatness of the glass substrate, and avoid the problem that the glass substrate is easily broken when entering the subsequent process equipment and the process equipment is caused shut down.

SUMMARY

The present disclosure provides a device and a system.

In a first aspect of the embodiments of the present disclosure, a device for testing flatness is provided, including:
 a base;
 a testing platform assembled on the base, wherein the testing platform includes a supporting structure, the supporting structure is disposed on a side of the testing platform away from the base, and is used to support the to-be-tested board, and the supporting structure matches with a structure of the to-be-tested board;
 a ranging sensor disposed on a side of the testing platform away from the base, wherein after the to-be-tested board is placed on the testing platform, the ranging sensor is used to test distances between a number N of to-be-tested positions on the to-be-tested board and the ranging sensor, to obtain N pieces of distance information, and the N pieces of distance information are used to determine the flatness of the to-be-tested board, where N is an integer greater than 2.

In an implementation, the device for testing flatness further includes a rotating shaft, a number M of said bases and M of said testing platforms, wherein the M bases are arranged around the rotating shaft, and the M bases are fixedly connected to the rotating shaft respectively, the M testing platforms are assembled on the M bases in a one-to-one correspondence, and the supporting structures of the M testing platforms are different; M is an integer greater than 1; and
the to-be-tested board is placed on one of the M testing platforms which is facing the ranging sensor.

In an implementation, the device for testing flatness further includes a driving mechanism, wherein the driving mechanism is disposed on a side of the testing platform away from the base, the ranging sensor is disposed on the driving mechanism, and the driving mechanism is used to drive the ranging sensor to move to the N to-be-tested positions respectively.

In an implementation, the driving mechanism includes a first linear driving mechanism, a second linear driving mechanism, and a third linear driving mechanism, wherein the first linear driving mechanism extends in a first direction, the second linear driving mechanism extends in a second direction, the third linear driving mechanism extends in a third direction, the first direction intersects the second direction, and the third direction is perpendicular to the first direction and the second direction;
 the first linear driving mechanism is disposed on the second linear driving mechanism, and the second linear driving mechanism is used to drive the first linear driving mechanism to move along the second linear driving mechanism;
 the third linear driving mechanism is disposed on the first linear driving mechanism, and the first linear driving mechanism is used to drive the third linear driving mechanism to move along the first linear driving mechanism;
 the ranging sensor is disposed on the third linear driving mechanism, and the third linear driving mechanism is used to drive the ranging sensor to move along the third linear driving mechanism.

In an implementation, the testing platform is detachably assembled on the base, and the device for testing flatness further includes a platform storage and a platform transmission mechanism;
 the platform storage includes a first storage space and a second storage space, the first storage space is used to store a standby testing platform, and the second storage space is an empty storage space; the supporting structure of the standby testing platform is different from the supporting structure of the testing platform assembled on the base;
 the platform transmission mechanism is used to transport the testing platform assembled on the base to the second storage space, and transport the standby testing platform stored in the first storage space to the base.

In an implementation, the platform transmission mechanism includes a plurality of first rollers, a plurality of second rollers, a plurality of third rollers, a plurality of fourth rollers, a first transmission belt, a second transmission belt, a third transmission belt, a fourth transmission belt, a fifth transmission belt, a sixth transmission belt, a first motor and a second motor;
 the base is disposed between the first transmission belt and the second transmission belt, and the platform storage is disposed between the third transmission belt and the fourth transmission belt;
 the first motor is used to drive the first transmission belt to rotate, and the second motor is used to drive the second transmission belt to rotate;
 the first transmission belt is used to drive the plurality of first rollers to roll, and the second transmission belt is used to drive the plurality of second rollers to roll;
 the fifth transmission belt is sleeved on one of the first rollers and one of the third rollers, and when the plurality of first rollers roll, the fifth transmission belt drives the plurality of third rollers to roll;

the sixth transmission belt is sleeved on one of the second rollers and one of the fourth rollers, and when the plurality of second rollers roll, the sixth transmission belt drives the plurality of fourth rollers to roll;

when the platform transmission mechanism transports the testing platform assembled on the base to the second storage space, the plurality of first rollers are disposed below the testing platform assembled on the base and in contact with the testing platform assembled on the base; the plurality of second rollers are disposed below the testing platform assembled on the base and in contact with the testing platform assembled on the base; and the plurality of third rollers and the plurality of fourth rollers are disposed below the second storage space; the first motor drives the first transmission belt to rotate; and the second motor drives the second transmission belt to rotate to drive the plurality of first rollers, the plurality of second rollers, the plurality of first rollers. and the plurality of fourth rollers rotate and transport the testing platform assembled on the base to the second storage space;

when the platform transmission mechanism transports the standby testing platform stored in the first storage space to the base, the plurality of third rollers are disposed below the standby testing platform stored in the first storage space, and in contact with the standby testing platform stored in the first storage space; the plurality of fourth rollers are disposed below the standby testing platform stored in the first storage space, and in contact with the standby testing platform stored in the first storage space; the plurality of first rollers are aligned with the plurality of third rollers; the plurality of second rollers are aligned with the plurality of fourth rollers; the first motor drives the first transmission belt to rotate, and the second motor drive the second transmission belt to rotate to drive the plurality of first rollers, the plurality of second rollers, the plurality of third rollers, and the plurality of fourth rollers to rotate and transport the standby testing platform stored in the first storage space to the base.

In an implementation, the device for testing flatness further includes a first lifting apparatus disposed below the base;

wherein before the platform transmission mechanism transports the testing platform assembled on the base to the second storage space, the first lifting apparatus is used to drive the base to move in a third direction, so that the plurality of first rollers are disposed below the testing platform assembled on the base and in contact with the testing platform assembled on the base, and the plurality of second rollers are disposed below the testing platform assembled on the base and in contact with the testing platform assembled on the base;

before the platform transmission mechanism transports the standby testing platform stored in the first storage space to the base, the first lifting apparatus is used to drive the base to move in the third direction until the platform transmission mechanism transports the standby testing platform stored in the first storage space to the base;

when the platform transmission mechanism is not working, the first lifting apparatus is used to drive the base to move in the third direction, so that the plurality of first rollers are disposed below the testing platform assembled on the base, and out of contact with the testing platform assembled on the base, and the plurality of second rollers are disposed below the testing platform assembled on the base, and out of contact with the testing platform assembled on the base.

In an implementation, the device for testing flatness further includes a control apparatus, a positioning apparatus and a second lifting apparatus, wherein the control apparatus is respectively connected to the positioning apparatus and the second lifting apparatus;

the second lifting apparatus is used to drive the platform storage to move in a third direction;

the control apparatus is used to, before the control apparatus controls the platform transmission mechanism to transport the testing platform assembled on the base to the second storage space, control the second lifting apparatus to drive the platform storage to move in the third direction until the positioning apparatus detects that the testing platform assembled on the base is aligned with the second storage space;

the control apparatus is also used to, before the platform transmission mechanism transports the standby testing platform stored in the first storage space to the base, control the second lifting apparatus to drive the platform storage to move in the third direction until the positioning apparatus detects that a position of the standby testing platform stored in the first storage space matches a position of the base.

In a second aspect of the embodiments of the present disclosure, a system for testing flatness is provided, including: a material storage, a guide mechanism, and the device for testing flatness described above;

the material storage and the device for testing flatness are arranged around the guide mechanism;

the material storage is used to store a to-be-tested board, and the guide mechanism is used to take the to-be-tested board from the material storage and place them on the testing platform of the device for testing flatness.

In an implementation, the system for testing flatness further includes an adjustment mechanism, wherein the guide mechanism is disposed between the adjustment mechanism and the device for testing flatness;

the guide mechanism is also used to take a to-be-tested board from the material storage and place the to-be-tested board on the adjustment mechanism;

the adjustment mechanism is used to rotate the to-be-tested board so that a structure of the to-be-tested board is the same as the supporting structure of the testing platform in the same direction;

the guide mechanism is also used to pick up the adjusted to-be-tested board from the adjustment mechanism and place the to-be-tested board on the testing platform.

In an implementation, the material storage is also used to perform a corrective operation on the to-be-tested board, so that the to-be-tested board is in a first designated position;

the adjustment mechanism is also used to perform a corrective operation on the to-be-tested board, so that the to-be-tested board is at a second designated position.

It can be seen from the above, since the testing platform includes a supporting structure, and the supporting structure matches the structure of the to-be-tested board, the testing platform can simulate the supporting structure of the to-be-tested board on the process equipment and simulate the force applied on the to-be-tested board from the process equipment, and can obtain the deformation of the to-be-tested board on the process equipment. Also, since the ranging sensor is disposed on the side of the testing platform away from the base, after the to-be-tested board is placed on the testing platform, the ranging sensor can test the distances respectively from the N to-be-tested positions on the to-be-tested board to the ranging sensor, to obtain N pieces of distance information which can be used to determine the flatness of the to-be-tested board, where N is an integer greater than.

It is to be understood that the above general descriptions and the below detailed descriptions are merely exemplary and explanatory, and are not intended to limit the present disclosure.

BRIEF DESCRIPTION OF THE DRAWINGS

The accompanying drawings, which are incorporated in and constitute a part of this specification, illustrate examples consistent with the present disclosure and, together with the description, serve to explain the principles of the disclosure.

DETAILED DESCRIPTION OF THE EMBODIMENTS

Figure 1:
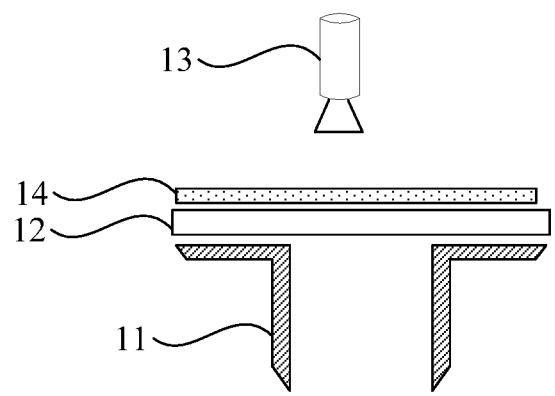
FIG. 1 is a schematic structural diagram of a device for testing flatness according to an implementation of the present disclosure.

Embodiments will be described in detail herein, with the illustrations thereof represented in the drawings. When the following descriptions involve the drawings, like numerals in different drawings refer to like or similar elements unless otherwise indicated. The implements described in the following embodiments do not represent all implements consistent with the present disclosure. Rather, they are merely examples of apparatuses and methods consistent with some aspects of the present disclosure as detailed in the appended claims.

An embodiment of the present disclosure provides a device for testing flatness. The device for testing flatness, as shown in FIG. 1, includes: a base 11, a testing platform 12 and a ranging sensor 13.

As shown in FIG. 1, the testing platform 12 is assembled on the base 11, and the testing platform 12 includes a supporting structure. The supporting structure is disposed on the side of the testing platform 12 away from the base 11 for supporting a to-be-tested board; the supporting structure matches the structures of the to-be-tested board.

The ranging sensor 13 is disposed on the side of the testing platform 12 away from the base 11. After a to-be-tested board is placed on the testing platform 12, the ranging sensor 13 is used to test distances between a number N of to-be-tested positions on the to-be-tested board and the ranging sensor 13, to obtain N pieces of distance information, and the N pieces of distance information are used to determine the flatness of the to-be-tested board, where N is an integer greater than 2.

In this embodiment, since the testing platform 12 includes a supporting structure, and the supporting structure matches the structure of the to-be-tested board, the testing platform 12 can simulate the supporting structure of the to-be-tested board on the process equipment and simulate the force applied on the to-be-tested board from the process equipment, and can obtain the deformation of the to-be-tested board on the process equipment. Also, since the ranging sensor 13 is disposed on the side of the testing platform 12 away from the base 11, after the to-be-tested board is placed on the testing platform 12, the ranging sensor 13 can test the distances respectively from the N to-be-tested positions on the to-be-tested board to the ranging sensor 13, to obtain N pieces of distance information which can be used to determine the flatness of the to-be-tested board, where N is an integer greater than 2. Accordingly, the technical solution provided by the embodiment of the present disclosure can simulate the force applied to the to-be-tested board from the process equipment and test the flatness of the to-be-tested board. Furthermore, the technical solution provided by the embodiment of the present disclosure can test the flatness of the glass substrate, so as to improve the manufacturing process to reduce the flatness of the glass substrate, and avoid the problem that the glass substrate is easily broken when entering the subsequent process equipment and the process equipment is caused shut down.

The device for testing flatness provided by the embodiment of the present disclosure has been briefly introduced above, and the device for testing flatness provided by the embodiment of the present disclosure will be described in detail below.

An implementation of the present disclosure also provides a device for testing flatness. The device for testing flatness, as shown in FIG. 1, includes: a base 11, a testing platform 12 and a ranging sensor 13.

In this implementation, the base 11 can be disposed on a rack (not shown). The number of the base 11 is one.

In this implementation, as shown in FIG. 1, the testing platform 12 is assembled on the base 11. Here, the testing platform 12 is detachably assembled on the base 11. However, the testing platform 12 can also be fixedly assembled on the base 11. When the testing platform 12 needs to be assembled on the base 11, the testing platform 12 can be manually assembled on the base 11, or the testing platform 12 can be assembled on the base 11 by an automated tool.

In this implementation, the device for testing flatness can further include a pneumatic gripper and a first cylinder. The pneumatic gripper is disposed on the base 11 and is used to secure the testing platform 12. The first cylinder is used to drive the pneumatic gripper to close and release. When the pneumatic gripper is closed, the testing platform 12 is secured on the base 11, and when the pneumatic gripper is released, the testing platform 12 can be removed. Here, the testing platform 12 can be removed manually or by an automated tool.

Figure 2:
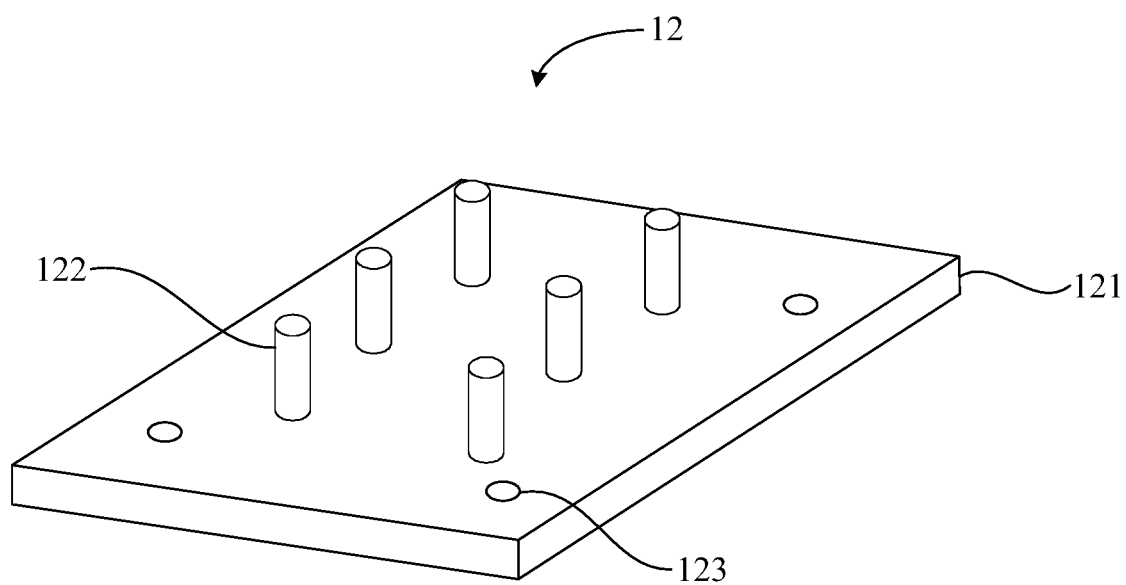
FIG. 2 is a schematic structural diagram of a testing platform according to an implementation of the present disclosure.

In this implementation, as shown in FIG. 2, the testing platform 12 includes a base plate 121, a supporting structure 122 and an installation positioning hole 123. The supporting structure 122 is disposed on the side of the base plate 121 away from the base 11, that is, the supporting structure 122 is disposed on the side of the testing platform 12 away from the base 11, and is used to support a to-be-tested board 14. The supporting structure 122 of the testing platform 12 matches the structure of the to-be-tested board 14. The installation positioning hole 123 is used to cooperate with a positioning pin on the to-be-tested board 14 to realize the positioning of the to-be-tested board 14, or to realize alignment of the to-be-tested board 14 and the testing platform 12.

In this implementation, the to-be-tested board 14 is a glass substrate. The glass substrate can include a glass base substrate and a driving circuit layer on the glass base substrate, but is not limited thereto. The glass substrate is a glass substrate in the process of producing the liquid crystal display base plate 121. However, the glass substrate can also be the glass substrate in the process of producing the OLED display substrate.

It should be noted that the process of producing the liquid crystal display substrate can include a plurality of process steps such as a molybdenum etching process, a vapor deposition process, and a sputtering process. In different process steps, the structure of the glass substrate can be different, and the supporting structure of the process equipment to the glass substrate can be different, for example, the positions of the supporting structures are different and the configurations of the supporting structure are different. For example, the supporting structure can include a plurality of support columns, and can also include a plurality of support pads, but is not limited thereto. Therefore, the corresponding testing platform 12 can be assembled on the base 11 according to the testing requirements. Here, the supporting structure 122 of the testing platform 12 is the same as the supporting structure of the process equipment used in the specific process. In each specific process, the structure of the to-be-tested board 14 supported on the process equipment can have a specific structure. Therefore, the supporting structure 122 of the testing platform 12 matches the structure of the to-be-tested board 14.

Figure 3:
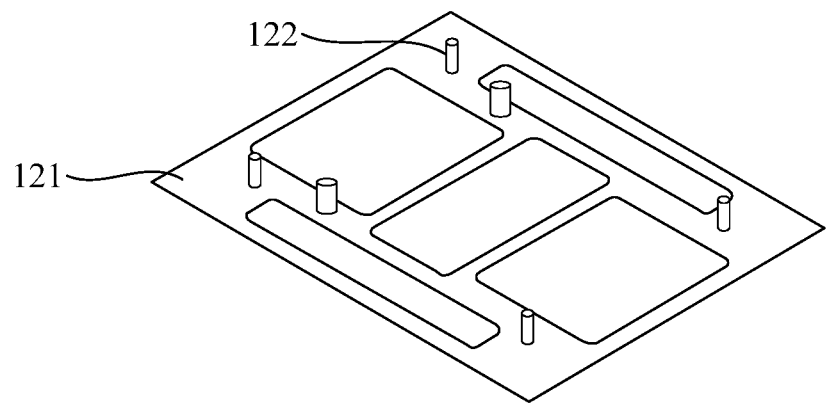
FIG. 3 is a schematic structural diagram of another testing platform according to an implementation of the present disclosure.

For example, in the molybdenum etching process, the supporting structure 122 of the process equipment for the glass substrate can be as shown in FIG. 3. Then, if the flatness of the glass substrate on the process equipment needs to be tested in the molybdenum etching process, the testing platform 12 can adopt the support structure 122 shown in FIG. 3. As shown in FIG. 3, the supporting structure 122 includes 6 support columns, the cross section of the support columns is circular, and diameters of the support columns can be different.

Figure 4:
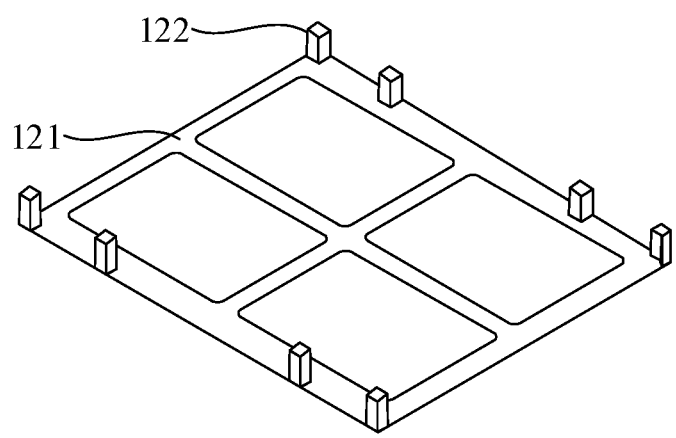
FIG. 4 is a schematic structural diagram of another testing platform according to an implementation of the present disclosure.

For another example, in the vapor deposition process, the supporting structure 122 of the process equipment for the glass substrate can be as shown in FIG. 4. Then, if the flatness of the glass substrate on the process equipment needs to be tested in the vapor deposition process, the testing platform 12 can adopt the support structure 122 shown in FIG. 4. As shown in FIG. 4, the supporting structure 122 includes 8 support columns, the cross section of the support columns is rectangular, and the size of the support columns can be the same.

Figure 5:
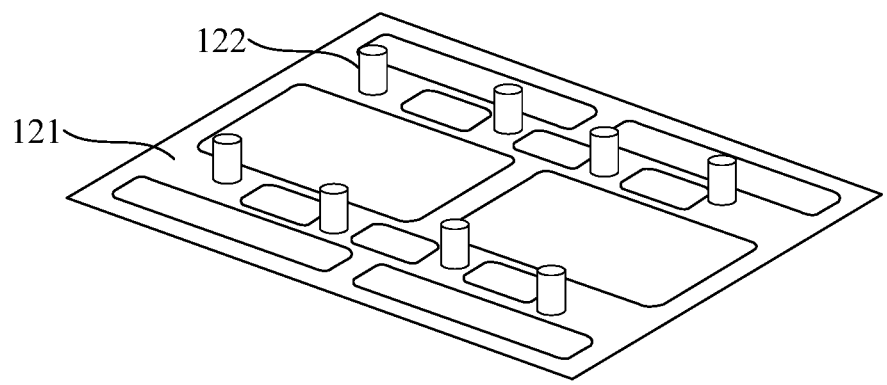
FIG. 5 is a schematic structural diagram of another testing platform according to an implementation of the present disclosure.

For another example, in the sputtering process, the supporting structure 122 of the process equipment for the glass substrate can be as shown in FIG. 5. Then, if the flatness of the glass substrate on the process equipment needs to be tested in the sputtering process, the testing platform 12 can adopt the support structure 122 shown in FIG. 5. As shown in FIG. 5, the supporting structure 122 includes 8 support columns, the cross section of the support columns is circular, and the diameter of the support columns can be the same.

In this implementation, as shown in FIG. 1, the ranging sensor 13 is disposed on the side of the testing platform 12 away from the base 11. When the flatness of the to-be-tested board needs to be tested, the to-be-tested board can be placed on the testing platform 12. After the to-be-tested board is placed on the testing platform 12, the ranging sensor 13 tests the distances between the N to-be-tested positions on the to-be-tested board and the ranging sensor 13 to obtain N pieces of distance information. The N pieces of distance information are used to determine the flatness of the to-be-tested board, and N is an integer greater than 2. For example, N is 3, 4, 5, 10, 15, 16, or 20, which is not limited thereto.

In this implementation, when the ranging sensor 13 tests the distance between a to-be-tested position on the to-be-tested board and the ranging sensor 13, the ranging sensor 13 can be disposed directly above the to-be-tested position, that is, the orthographic projection of the ranging sensor 13 on the to-be-tested board coincides with the to-be-tested position.

In this implementation, the number of the ranging sensors 13 can be one, or two, three, or more than three. When the number of the ranging sensors 13 is less than N, the distance between the to-be-tested positions on the to-be-tested board and the ranging sensor 13 can be tested by moving the position of the ranging sensor 13. The position of the ranging sensor 13 can be moved by an automated tool or manually. When the number of ranging sensors 13 is large, the testing efficiency can be improved. It should be noted that the automation tools herein are a collective term, rather than a term of a specific device.

In this implementation, since the testing platform 12 includes a supporting structure 122, and the supporting structure 122 matches the structure of the glass substrate, the testing platform 12 can simulate the supporting structure 122 of the glass substrate on the process equipment and simulate the force applied on the glass substrate from the process equipment. Also, since the testing platform 12 is provided with a ranging sensor 13 on the side away from the base 11, when the glass substrate is placed on the testing platform 12, the ranging sensor 13 can test the distances respectively from the N to-be-tested positions on the to-be-tested board to the ranging sensor 13, to obtain N pieces of distance information which can be used to determine the flatness of the to-be-tested board. Accordingly, the technical solution provided by the implementation of the present disclosure can simulate the force applied to the to-be-tested board from the process equipment and test the flatness of the to-be-tested board. Furthermore, the technical solution provided by the implementation of the present disclosure can test the flatness of the glass substrate, so as to improve the manufacturing process to reduce the flatness of the glass substrate, and avoid the problem that the glass substrate is easily broken when entering the subsequent process equipment causing the process equipment to shut down.

An implementation of the present disclosure also provides a device for testing flatness. The device for testing flatness, as shown in FIG. 6, includes: a rotating shaft 15, a base 11, a testing platform 12, a ranging sensor 13 and a driving mechanism 16.

Figure 6:
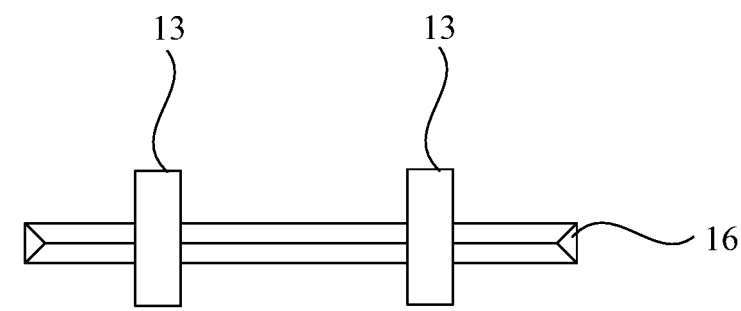
FIG. 6 is a schematic structural diagram of another device for testing flatness according to an implementation of the present disclosure.
Figure 6:
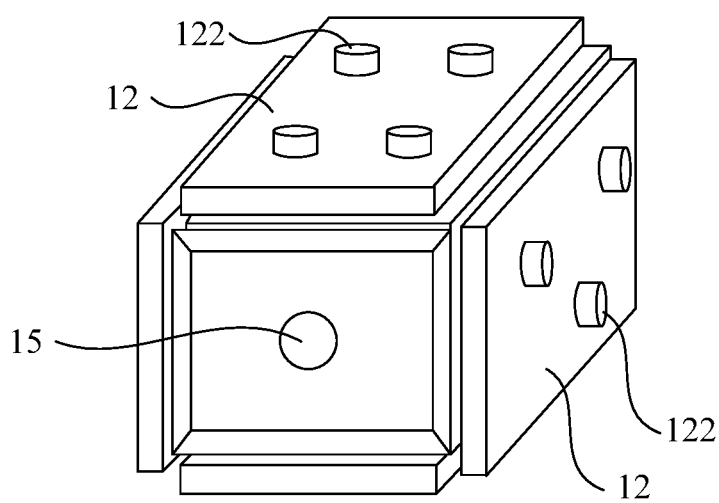

As shown in FIG. 6, in this implementation, the device for testing flatness includes four bases 11. The four bases 11 are arranged around a rotating shaft 15, and the four bases 11 are fixedly connected to the rotating shaft 15 respectively, and there are four testing platforms 12 which are assembled on the four bases 11 in a one-to-one correspondence, and the supporting structures 122 of the four testing platforms 12 are different. For example, the four testing platforms 12 respectively correspond to the supporting structures of the glass substrate by different kinds of process equipment. However, in other implementations, two, three, five, six, or other numbers of testing platforms 12 can also be provided around the rotating shaft 15.

Figure 7:
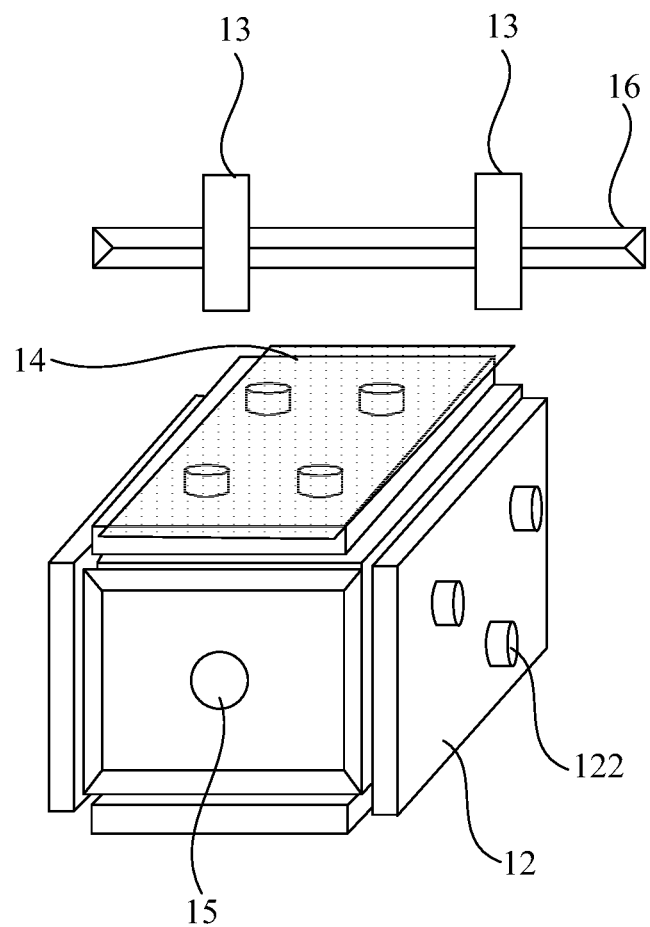
FIG. 7 is a schematic structural diagram of another device for testing flatness according to an implementation of the present disclosure.

As shown in FIG. 7, in this implementation, the to-be-tested board 14 is placed on one of the four testing platforms 12 which is facing the ranging sensor 13. When the other three testing platforms 12 are not facing the ranging sensor 13, the to-be-tested board 14 is not placed on the three testing platforms. By rotating the rotating shaft 15, the testing platform 12 meeting the testing requirements can be rotated to a position facing the ranging sensor 13. For example, the testing platform 12 facing the ranging sensor 13 can be switched every time the rotating shaft 15 rotates 90 degrees. The rotating shaft 15 can be connected to a driving motor through a coupling or a belt to obtain rotating power, but it is not limited to this.

In this implementation, the driving mechanism 16 is disposed on the side of the testing platform 12 away from the base 11, the ranging sensor 13 is disposed on the driving mechanism 16, and the driving mechanism 16 is used to drive the ranging sensor 13 to move to N to-be-tested positions respectively. It can be understood that when there is only one ranging sensor 13 on the driving mechanism 16, the ranging sensor 13 drives the ranging sensor 13 to move to the N to-be-tested positions respectively. When there are two ranging sensors 13 connected to the driving mechanism 16, the two ranging sensors 13 can be simultaneously driven to N/2 to-be-tested positions respectively to obtain N pieces of distance information in total, which can improve the testing efficiency. When there are more than two ranging sensors 13 connected to the driving mechanism 16, by driving the ranging sensors 13, the ranging sensors 13 can collect N pieces of distance information corresponding to the N to-be-tested positions.

Figure 8:
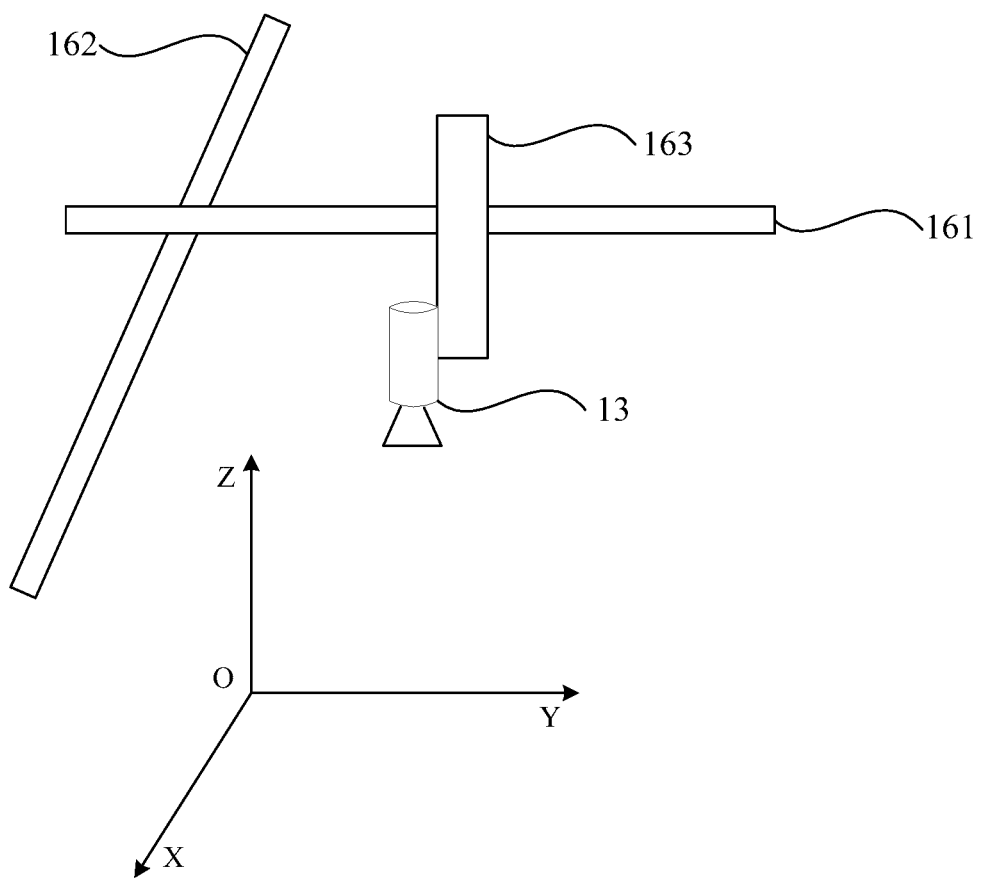
FIG. 8 is a schematic structural diagram of another device for testing flatness according to an implementation of the present disclosure.

In this implementation, as shown in FIG. 8, the driving mechanism 16 includes a first linear driving mechanism 161, a second linear driving mechanism 162 and a third linear driving mechanism 163. The first linear driving mechanism 161 extends in a first direction, the second linear driving mechanism 162 extends in a second direction, and the third linear driving mechanism 163 extends in a third direction, the first direction intersects the second direction, and the third direction is perpendicular to the first direction and the second direction. Here, the first direction is the Y direction, the second direction is the X direction, the third direction is the Z direction, and the first direction and the second direction are perpendicular to each other.

The first linear driving mechanism 161 is disposed on the second linear driving mechanism 162, and the second linear driving mechanism 162 is used to drive the first linear driving mechanism 161 to move along the second linear driving mechanism 162. The third linear driving mechanism 163 is disposed on the first linear driving mechanism 161, and the first linear driving mechanism 161 is used to drive the third linear driving mechanism 163 to move along the first linear driving mechanism 161. The ranging sensor 13 is disposed on the third linear driving mechanism 163, and the third linear driving mechanism 163 is used to drive the ranging sensor 13 to move along the third linear driving mechanism 163. In this way, the ranging sensor 13 can move in the first direction, the second direction, and the third direction, respectively. Before placing the to-be-tested board on the testing platform 12, the ranging sensor 13 can be driven to move in the third direction away from the testing platform 12 to provide enough space to facilitate the placement of the to-be-tested board on the testing platform 12.

An implementation of the present disclosure also provides a device for testing flatness. On the basis of the implementation shown in FIG. 6, in this implementation, as shown in FIGS. 9 to 10, the device for testing flatness further includes: a platform storage 61, a platform transmission mechanism (not shown), a control apparatus (not shown), a positioning apparatus (not shown), a first lifting apparatus (not shown), and a second lifting apparatus (not shown).

Figure 9:
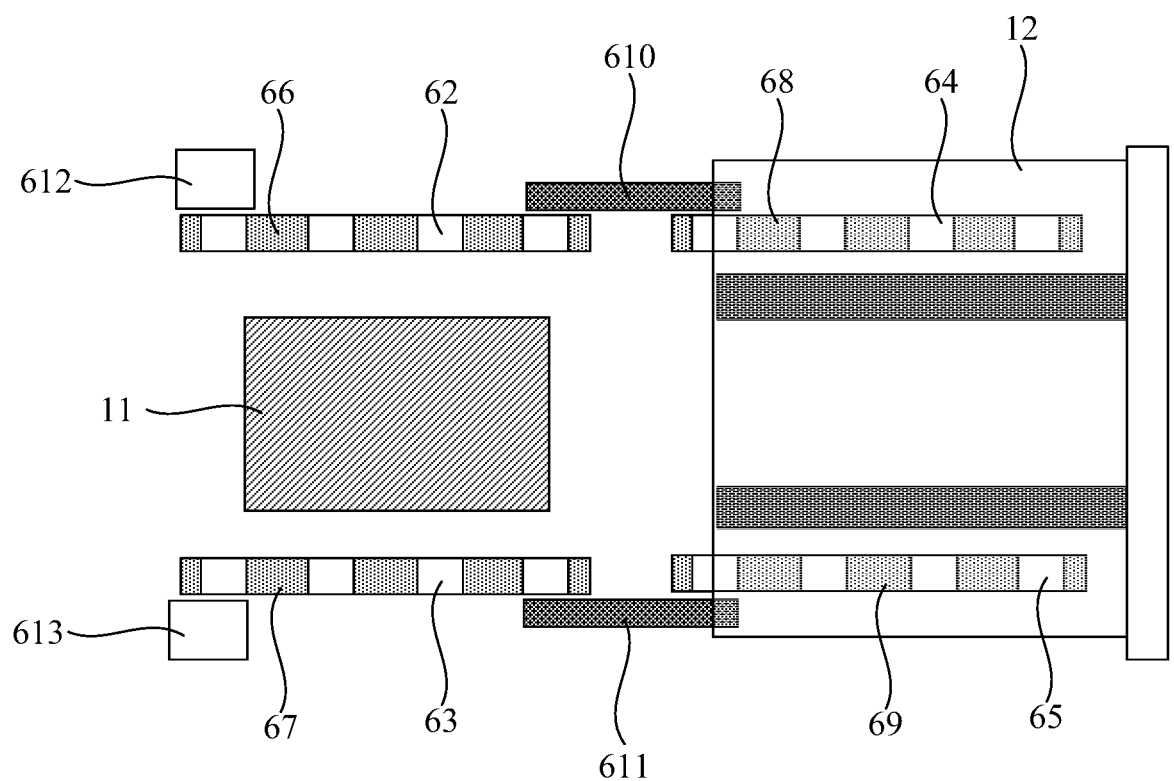
FIG. 9 is a schematic structural diagram of another device for testing flatness according to an implementation of the present disclosure.
Figure 10:
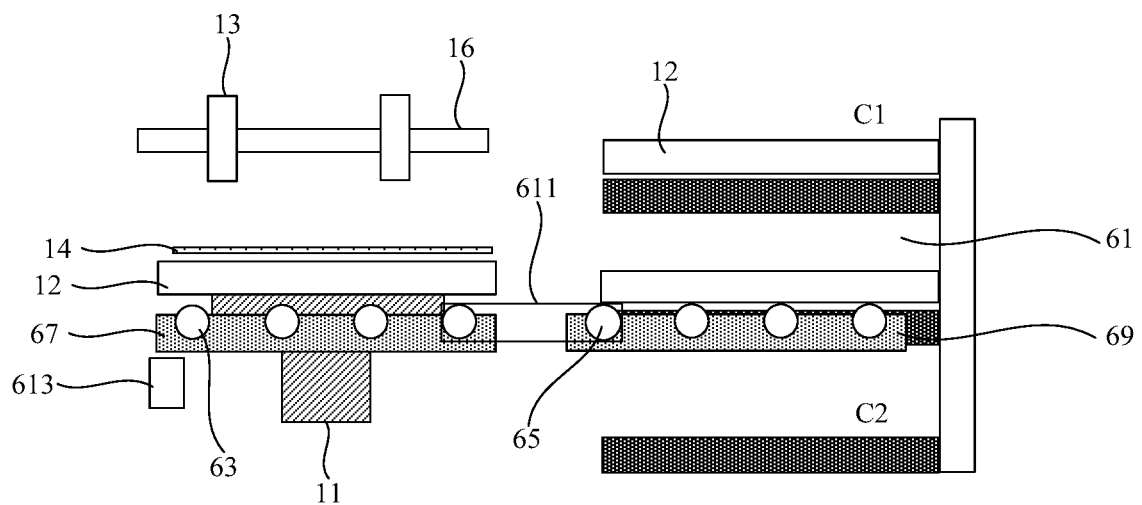
FIG. 10 is a schematic structural diagram of another device for testing flatness according to an implementation of the present disclosure.

In this implementation, as shown in FIG. 9, the platform storage 61 includes a first storage space C1 and a second storage space C2. The first storage space C1 is used to store one or more standby testing platforms 12, and the second storage space C2 is an empty storage space. The supporting structure 122 of the standby testing platform 12 is different from the supporting structure 122 of the testing platform 12 assembled on the base 11, and the standby testing platform 12 is used to replace the testing platform 12 assembled on the base 11. The empty storage space is used to store the testing platform 12 detached from the base 11. Each of the positions of the testing platforms 12 in the platform storage 61 can be recorded in the memory of the device for testing flatness for query.

In this implementation, the platform transmission mechanism is used to transport the testing platform 12 assembled on the base 11 to the second storage space C2, and transport the standby testing platform 12 stored in the first storage space C1 to the base 11.

In this implementation, as shown in FIG. 9, the platform transmission mechanism includes a plurality of first rollers 62, a plurality of second rollers 63, a plurality of third rollers 64, a plurality of fourth rollers 65, a first transmission belt 66, a second transmission belt 67, a third transmission belt 68, a fourth transmission belt 69, a fifth transmission belt 610, a sixth transmission belt 611, a first motor 612 and a second motor 613.

In this implementation, the first transmission belt 66, the second transmission belt 67, the third transmission belt 68, the fourth transmission belt 69, the fifth transmission belt 610, and the sixth transmission belt 611 can be leather belts.

As shown in FIG. 9, the base 11 is disposed between the first transmission belt 66 and the second transmission belt 67, and the platform storage 61 is disposed between the third transmission belt 68 and the fourth transmission belt 69.

In this implementation, the first motor 612 is used to drive the first transmission belt 66 to rotate, and the second motor 613 is used to drive the second transmission belt 67 to rotate. The first motor 612 and the second motor 613 operate synchronously. For example, the first motor 612 and the second motor 613 are started at the same time and stopped at the same time, and the rotation direction of the first motor 612 is the same as the rotation direction of the second motor 613. Here, the first transmission belt 66 is used to drive the plurality of first rollers 62 to roll, and the second transmission belt 67 is used to drive the plurality of second rollers 63 to roll.

As shown in FIG. 9, the fifth transmission belt 610 is sleeved on one of the first rollers 62 and one of the third rollers 64. When the plurality of first rollers 62 roll, the fifth transmission belt 610 drives the plurality of third rollers 64 to roll. The distance between the first roller 62 and the third roller 64 which are sleeved by the fifth transmission belt 610 is the smallest, and the distance between the third roller 64 and the first roller 62 which are sleeved by the fifth transmission belt 610 is the smallest.

As shown in FIG. 9, the sixth transmission belt 611 is sleeved on one of the second rollers 63 and one of the fourth rollers 65. When the plurality of second rollers 63 roll, the sixth transmission belt 611 drives the plurality of fourth rollers 65 to roll. The distance between the second roller 63 and the fourth roller 65 which are sleeved by the sixth transmission belt 611 is the smallest, and the distance between the fourth roller 65 and the second roller 63 which are sleeved by the sixth transmission belt 611 is the smallest.

When the platform transmission mechanism transports the testing platform 12 assembled on the base 11 to the second storage space C2, the platform transmission mechanism performs a closing action, and the plurality of first rollers 62 are disposed below the testing platform 12 assembled on the base 11 and in contact with the testing platform 12 assembled on the base 11; the plurality of second rollers 63 are disposed below the testing platform 12 assembled on the base 11, and in contact with the testing platform 12 assembled on the base 11; and the plurality of third rollers 64 and the plurality of fourth rollers 65 are disposed below the second storage space C2. The first motor 612 drives the first transmission belt 66 to rotate, and the second motor 613 drives the second transmission belt 67 to rotate to drive the plurality of first rollers 62, the plurality of second rollers 63, the plurality of third rollers 64, and the a plurality of fourth rollers 65 to rotate and to transport the testing platform 12 assembled on the base 11 to the second storage space C2.

When the platform transmission mechanism transports the standby testing platform 12 stored in the first storage space C1 to the base 11, the platform transmission mechanism performs a closing action, and the plurality of third rollers 64 are disposed below the standby testing platform 12 stored in the first storage space C1, and in contact with the standby testing platform 12 stored in the first storage space C1; the plurality of fourth rollers 65 are disposed below the standby testing platform 12 stored in the first storage space C1, and in contact with the standby testing platform 12 stored in the first storage space C1; the plurality of first rollers 62 are aligned with the plurality of third rollers 64, the plurality of second rollers 63 are aligned with the plurality of fourth rollers 65; the position of the first roller 62 and the position of the second roller 63 match with the position of the base 11, so that the standby testing platform 12 can be transported to the base 11 through the first rollers 62 and the second rollers 63. The first motor 612 drives the first transmission belt 66 to rotate, and the second motor 613 drives the second transmission belt 67 to rotate to drive the plurality of first rollers 62, the plurality of second rollers 63, the plurality of third rollers 64, and the plurality of fourth rollers 65 to rotate and to transport the standby testing platform 12 stored in the first storage space C1 to the base 11.

In this implementation, when the platform transmission mechanism transports the testing platform 12 assembled on the base 11 to the second storage space C2 and when the platform transmission mechanism transports the standby testing platform 12 stored in the first storage space C1 to the base 11, the platform transmission mechanism performs the closing action. When the platform transmission mechanism is not working, the platform transmission mechanism performs an opening action, and the platform transmission mechanism moves away from the testing platform 12 and the platform storage 61. That is, the opening action and the closing action are actions along the X direction. Here, the aforementioned closing and opening actions can be realized pneumatically. For example, the device for testing flatness includes a third cylinder, and the third cylinder provides power for realizing the aforementioned closing and opening actions.

In this implementation, the first lifting apparatus is disposed below the base 11. The first lifting apparatus can include a fourth cylinder. The fourth cylinder is used to provide power for the first lifting apparatus. The first lifting apparatus is used to move the base 11 up and down along a third direction. Here, moving upward in the third direction refers to moving in the positive direction of the Z axis, and moving downward in the third direction refers to moving in the negative direction of the Z axis.

In this implementation, before the platform transmission mechanism transports the testing platform 12 assembled on the base 11 to the second storage space C2, the first lifting apparatus is used to drive the base 11 to move downward in the third direction, so that the plurality of first rollers 62 are disposed below the testing platform 12 assembled on the base 11 and in contact with the testing platform 12 assembled on the base 11, and the plurality of second rollers 63 are disposed below the testing platform 12 assembled on the base 11 and in contact with the testing platform 12 assembled on the base 11.

In this implementation, before the platform transmission mechanism transports the standby testing platform 12 stored in the first storage space C1 to the base 11, the first lifting apparatus is used to drive the base 11 to move downward in the third direction until the platform transmission mechanism transports the standby testing platform 12 stored in the first storage space C1 to the base 11.

When the platform transmission mechanism is not working, the first lifting apparatus is used to drive the base 11 to move upward in the third direction, so that the plurality of first rollers 62 are disposed below the testing platform 12 assembled on the base 11 and out of contact with the testing platform 12 assembled on the base 11, and the plurality of second rollers 63 are disposed below the testing platform 12 assembled on the base 11, and are out of contact with the testing platform 12 assembled on the base 11, which facilitates the platform transmission mechanism to perform the opening action away from the testing platform 12 and the platform storage 61, to avoid misalignment of the testing platform 12 on the base 11.

In this implementation, the second lifting apparatus is used to drive the platform storage 61 to move in the third direction. The second lifting apparatus can include a second cylinder. The second cylinder is used to provide power for the second lifting apparatus.

In this implementation, the control apparatus is respectively connected to the positioning apparatus and the second lifting apparatus. Before the control apparatus controls the platform transmission mechanism to transport the testing platform 12 assembled on the base 11 to the second storage space C2, the control apparatus controls the second lifting apparatus to drive the platform storage 61 to move in the third direction until the positioning apparatus detects the testing platform 12 assembled on the base 11 is aligned with the second storage space C2. Here, the positioning apparatus includes a plurality of proximity sensors and metal pieces, the metal pieces are disposed on the platform storages 61, the plurality of proximity sensors are disposed on the frame, and the plurality of proximity sensors correspond to a plurality of positions in a one-to-one correspondence. When the testing platform 12 assembled on the base 11 needs to be aligned with one of the second storage spaces C2, the corresponding proximity sensor is enabled, other proximity sensors is disabled, and the second lifting apparatus drives the platform storage 61 to move in the third direction. When the proximity sensor detects the metal piece, it is regarded as detecting that the testing platform 12 assembled on the base 11 is aligned with the second storage space C2. However, the implementation of the positioning apparatus is not limited to the proximity sensor and metal pieces in this implementation.

In this implementation, before the platform transmission mechanism transports the standby testing platform 12 stored in the first storage space C1 to the base 11, the control apparatus also controls the second lifting apparatus to drive the platform storage 61 to move in the third direction, until the positioning apparatus detects that the position of the standby testing platform 12 stored in the first storage space C1 matches the position of the base 11, that is, the standby testing platform 12 stored in the first storage space C1 can be transported to the base 11 through the platform transmission mechanism.

Figure 11:
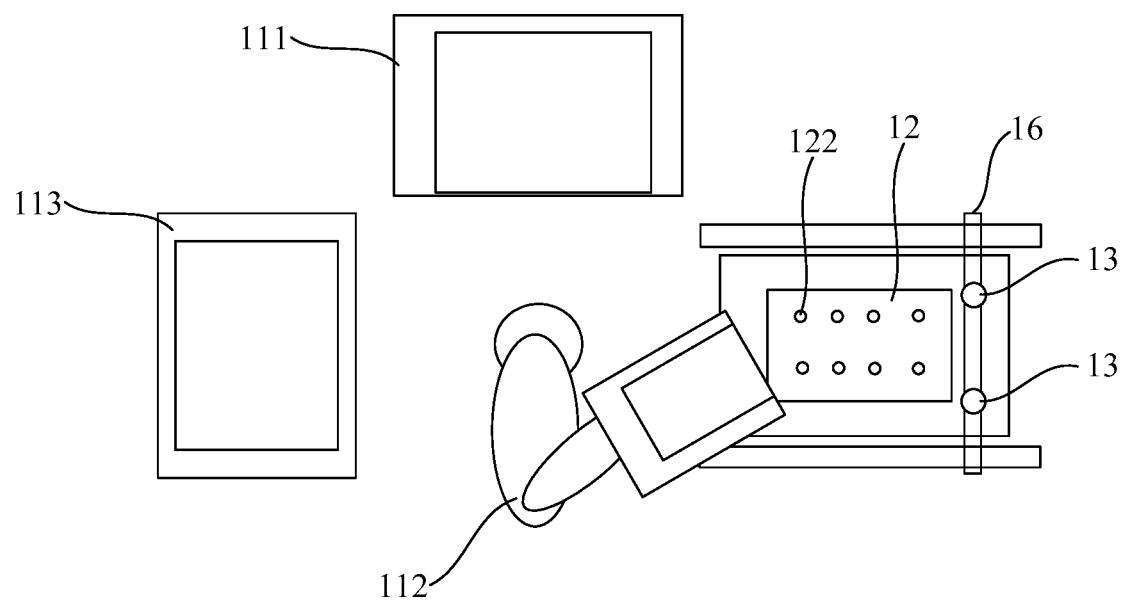
FIG. 11 is a schematic structural diagram of a system for testing flatness according to an implementation of the present disclosure.

An embodiment of the present disclosure also provides a system for testing flatness. As shown in FIG. 11, the system for testing flatness includes: a material storage 111, a guide mechanism 112, and the device for testing flatness of any one of the above embodiment.

As shown in FIG. 11, the material storage 111 and the device for testing flatness are arranged around the guide mechanism 112. The guide mechanism 112 can be, for example, a robot arm.

In this embodiment, the material storage 111 is used to store a to-be-tested board, for example, to store a glass substrate.

In this embodiment, the guide mechanism 112 is used to take a to-be-tested board from the material storage 111 and place it on the testing platform 12 of the device for testing flatness, and is also used to remove the to-be-tested board away from the testing platform 12 after the testing is completed and place it in the material storage 111. When the guide mechanism 112 is not working, the guide mechanism 112 returns to an idle station and waits for the next instruction to be executed.

In this embodiment, the material storage 111 is also used to perform corrective operations on the to-be-tested board, so that the to-be-tested board is placed at a first designated position. In this way, when the guide mechanism 112 takes the to-be-tested board from the material storage 111, the relative positions of the guide mechanism 112 and the to-be-tested board is known, which is convenient for controlling the position of the to-be-tested board on the testing platform 12.

In this embodiment, the system for testing flatness further includes a data processing unit for processing the obtained N pieces of distance information to determine the flatness of the to-be-tested board.

The embodiment of the present disclosure also provides a system for testing flatness. As shown in FIG. 11, the system for testing flatness includes: a material storage 111, a guide mechanism 112, an adjustment mechanism 113, and the device for testing flatness of any of the above embodiments.

In this embodiment, the material storage 111, the adjustment mechanism 113 and the device for testing flatness are arranged around the guide mechanism 112.

In this embodiment, the guide mechanism 112 is used to take out the to-be-tested board from the material storage 111 and place it on the adjustment mechanism 113. The adjustment mechanism 113 is used to rotate the to-be-tested board so that the structure of the to-be-tested board is the same as the supporting structure 122 of the testing platform 12 in the same direction. In this way, after the guide mechanism 112 picks up the adjusted to-be-tested board from the adjusting mechanism 113, the guide mechanism 112 does not need to perform a rotation operation, and only needs to perform a translation operation to place the to-be-tested board on the testing platform 12, which is convenient for controlling the position of the to-be-tested board on the testing platform 12.

In this embodiment, the adjustment mechanism 113 is also used to perform a corrective operation on the to-be-tested board, so that the to-be-tested board is in a second designated position, so that when the guide mechanism 112 takes the to-be-tested board from the adjustment mechanism 113 At this time, the relative position of the guide mechanism 112 and the to-be-tested board is known, which is convenient for controlling the position of the to-be-tested board on the testing platform 12.

In this embodiment, the guide mechanism 112 is used to pick up the adjusted to-be-tested board from the adjustment mechanism 113 and place it on the testing platform 12.

Figure 12:
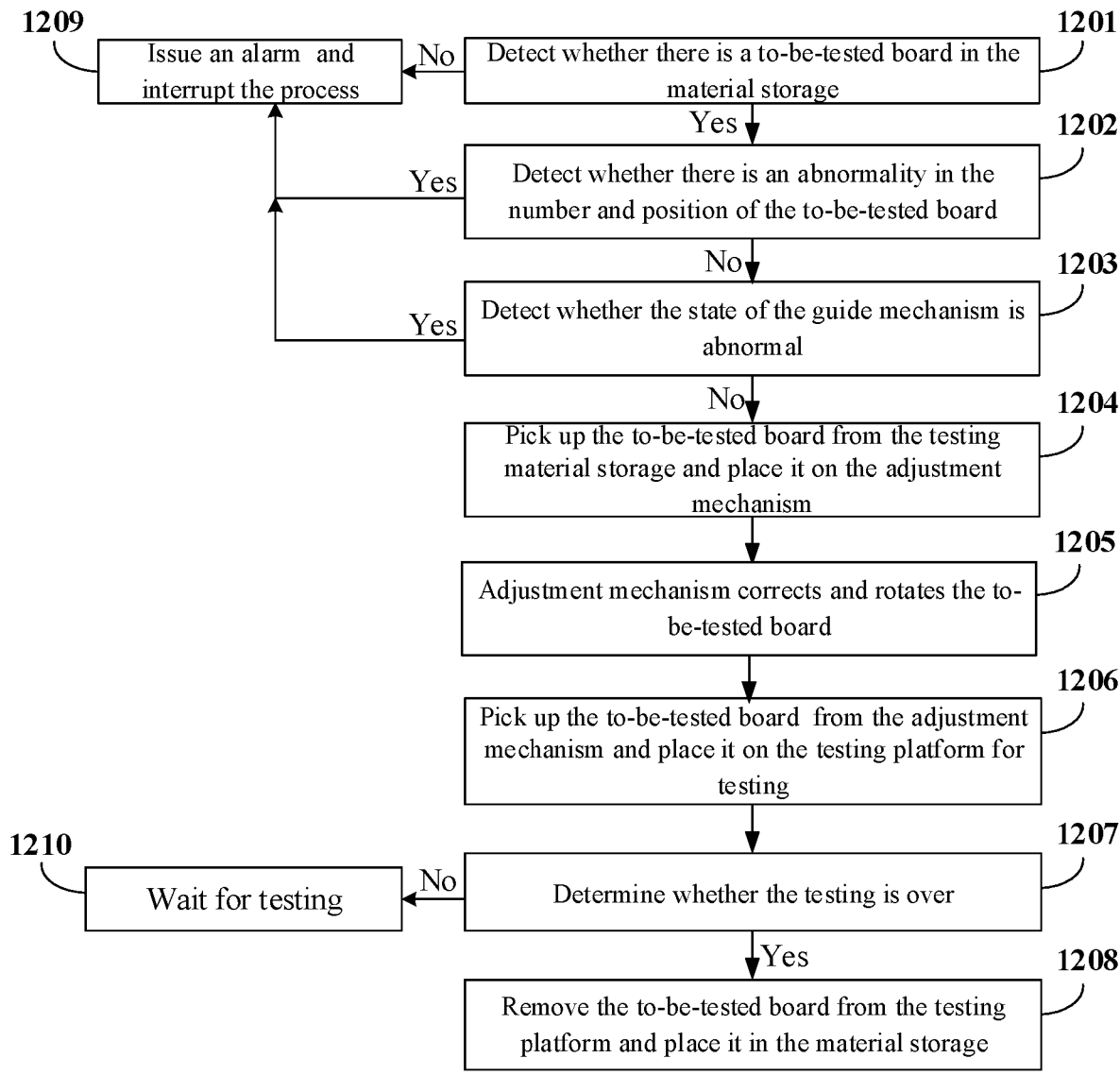
FIG. 12 is a schematic flowchart of an operation method of the system for testing flatness according to an implementation of the present disclosure.

In this embodiment, the working process of the system for testing flatness can be as shown in FIG. 12, including the following steps 1201 to 1210:

In step 1201, it is detected whether there is a to-be-tested board in the material storage 111. If so, go to step 1202, if not, go to step 1209.

In step 1202, it is detected whether there is an abnormality in the number and position of the to-be-tested board. If not, go to step 1203, and if so, go to step 1209.

In step 1203, it is detected whether the state of the guide mechanism 112 is abnormal. If not, go to step 1204, and if so, go to step 1209.

In step 1204, the to-be-tested board is picked up from the testing material storage 111 and placed on the adjustment mechanism 113.

In step 1205, the adjustment mechanism 113 corrects and rotates the to-be-tested board.

In step 1206, the to-be-tested board is picked up from the adjustment mechanism 113 and placed on the testing platform 12 for testing. In this step, the purpose of testing is to obtain N pieces of distance information to determine the flatness of the to-be-tested board.

In step 1207, it is determined whether the testing is over. If so, go to step 1208, if not, go to step 1210.

In step 1208, the to-be-tested board is removed from the testing platform 12 and placed in the material storage 111.

In step 1209, an alarm is issued and the process is interrupted.

In step 1210, wait for testing.

Here, the work of the system for testing flatness has been described above, and will not be repeated here.

In this embodiment, it is possible to simulate the force applied to the to-be-tested board from the process equipment and test the flatness of the to-be-tested board. Furthermore, the technical solution provided by the embodiments of the present disclosure can test the flatness of the glass substrate, so as to improve the manufacturing process to reduce the flatness of the glass substrate, and avoid the problem that the glass substrate is easily broken when entering the subsequent process equipment and the process equipment is caused shut down.

Here, the processes used in the above embodiments can include, for example, film forming processes such as deposition and sputtering, and patterning processes such as etching.

It should be pointed out that in the drawings, the sizes of layers and regions can be exaggerated for clarity of illustration. It will also be understood that when an element or layer is referred to as being "on" another element or layer, it can be directly on the other element or intervening layers can be present. In addition, it will be understood that when an element or layer is referred to as being "under" another element or layer, it can be directly under the other element, or there can be more than one intervening layer or element. In addition, it can also be understood that when a layer or element is referred to as being "between" two layers or two elements, it can be the only layer between the two layers or two elements, or more than one intervening layer or element can also be present. Similar reference numerals indicate similar elements throughout.

In the present disclosure, the terms "first" and "second" are only used for descriptive purposes, and cannot be understood as indicating or implying relative importance. The term "plurality" refers to two or more, unless specifically defined otherwise.

Other implementations of the present disclosure will be apparent to those skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and examples are considered as exemplary only, with a true scope and spirit of the present disclosure being indicated by the following claims.

It is to be understood that the present disclosure is not limited to the precise structure described above and shown in the accompanying drawings, and that various modifications and changes may be made without departing from the scope thereof. The scope of the present disclosure is limited only by the appended claims.

What is claimed is:

1. A device for testing flatness, comprising:
a base;
a testing platform assembled on the base, wherein the testing platform comprises a supporting structure, the supporting structure is disposed on a side of the testing platform away from the base, and is used to support the to-be-tested board, and the supporting structure matches with a structure of the to-be-tested board;
a ranging sensor disposed on a side of the testing platform away from the base, wherein after the to-be-tested board is placed on the testing platform, the ranging sensor is used to test distances between a number N of to-be-tested positions on the to-be-tested board and the ranging sensor, to obtain N pieces of distance information, and the N pieces of distance information are used to determine the flatness of the to-be-tested board, where N is an integer greater than 2.

2. The device for testing flatness according to claim 1, further comprising a rotating shaft, a number M of said bases and M of said testing platforms, wherein the M bases are arranged around the rotating shaft, and the M bases are fixedly connected to the rotating shaft respectively, the M testing platforms are assembled on the M bases in a one-to-one correspondence, and the supporting structures of the M testing platforms are different; M is an integer greater than 1; and
the to-be-tested board is placed on one of the M testing platforms which is facing the ranging sensor.

3. The device for testing flatness according to claim 1, further comprising a driving mechanism, wherein the driving mechanism is disposed on a side of the testing platform away from the base, the ranging sensor is disposed on the driving mechanism, and the driving mechanism is used to drive the ranging sensor to move to the N to-be-tested positions respectively.

4. The device for testing flatness according to claim 3, wherein the driving mechanism comprises a first linear driving mechanism, a second linear driving mechanism, and a third linear driving mechanism, wherein the first linear driving mechanism extends in a first direction, the second linear driving mechanism extends in a second direction, the third linear driving mechanism extends in a third direction, the first direction intersects the second direction, and the third direction is perpendicular to the first direction and the second direction;
the first linear driving mechanism is disposed on the second linear driving mechanism, and the second linear driving mechanism is used to drive the first linear driving mechanism to move along the second linear driving mechanism;
the third linear driving mechanism is disposed on the first linear driving mechanism, and the first linear driving mechanism is used to drive the third linear driving mechanism to move along the first linear driving mechanism;
the ranging sensor is disposed on the third linear driving mechanism, and the third linear driving mechanism is used to drive the ranging sensor to move along the third linear driving mechanism.

5. The device for testing flatness according to claim 1, wherein the testing platform is detachably assembled on the base, and the device for testing flatness further comprises a platform storage and a platform transmission mechanism;
the platform storage comprises a first storage space and a second storage space, the first storage space is used to store a standby testing platform, and the second storage space is an empty storage space; the supporting structure of the standby testing platform is different from the supporting structure of the testing platform assembled on the base;
the platform transmission mechanism is used to transport the testing platform assembled on the base to the second storage space, and transport the standby testing platform stored in the first storage space to the base.

6. The device for testing flatness according to claim 5, wherein the platform transmission mechanism comprises a plurality of first rollers, a plurality of second rollers, a plurality of third rollers, a plurality of fourth rollers, a first transmission belt, a second transmission belt, a third transmission belt, a fourth transmission belt, a fifth transmission belt, a sixth transmission belt, a first motor and a second motor;
the base is disposed between the first transmission belt and the second transmission belt, and the platform storage is disposed between the third transmission belt and the fourth transmission belt;

the first motor is used to drive the first transmission belt to rotate, and the second motor is used to drive the second transmission belt to rotate;

the first transmission belt is used to drive the plurality of first rollers to roll, and the second transmission belt is used to drive the plurality of second rollers to roll;

the fifth transmission belt is sleeved on one of the first rollers and one of the third rollers, and when the plurality of first rollers roll, the fifth transmission belt drives the plurality of third rollers to roll;

the sixth transmission belt is sleeved on one of the second rollers and one of the fourth rollers, and when the plurality of second rollers roll, the sixth transmission belt drives the plurality of fourth rollers to roll;

when the platform transmission mechanism transports the testing platform assembled on the base to the second storage space, the plurality of first rollers are disposed below the testing platform assembled on the base and in contact with the testing platform assembled on the base; the plurality of second rollers are disposed below the testing platform assembled on the base and in contact with the testing platform assembled on the base; and the plurality of third rollers and the plurality of fourth rollers are disposed below the second storage space; the first motor drives the first transmission belt to rotate; and the second motor drives the second transmission belt to rotate to drive the plurality of first rollers, the plurality of second rollers, the plurality of first rollers, and the plurality of fourth rollers rotate and transport the testing platform assembled on the base to the second storage space;

when the platform transmission mechanism transports the standby testing platform stored in the first storage space to the base, the plurality of third rollers are disposed below the standby testing platform stored in the first storage space, and in contact with the standby testing platform stored in the first storage space; the plurality of fourth rollers are disposed below the standby testing platform stored in the first storage space, and in contact with the standby testing platform stored in the first storage space; the plurality of first rollers are aligned with the plurality of third rollers; the plurality of second rollers are aligned with the plurality of fourth rollers; the first motor drives the first transmission belt to rotate, and the second motor drive the second transmission belt to rotate to drive the plurality of first rollers, the plurality of second rollers, the plurality of third rollers, and the plurality of fourth rollers to rotate and transport the standby testing platform stored in the first storage space to the base.

7. The device for testing flatness according to claim 6, further comprising a first lifting apparatus disposed below the base;

wherein before the platform transmission mechanism transports the testing platform assembled on the base to the second storage space, the first lifting apparatus is used to drive the base to move in a third direction, so that the plurality of first rollers are disposed below the testing platform assembled on the base and in contact with the testing platform assembled on the base, and the plurality of second rollers are disposed below the testing platform assembled on the base and in contact with the testing platform assembled on the base;

before the platform transmission mechanism transports the standby testing platform stored in the first storage space to the base, the first lifting apparatus is used to drive the base to move in the third direction until the platform transmission mechanism transports the standby testing platform stored in the first storage space to the base;

when the platform transmission mechanism is not working, the first lifting apparatus is used to drive the base to move in the third direction, so that the plurality of first rollers are disposed below the testing platform assembled on the base, and out of contact with the testing platform assembled on the base, and the plurality of second rollers are disposed below the testing platform assembled on the base, and out of contact with the testing platform assembled on the base.

8. The device for testing flatness according to claim 5, further comprising a control apparatus, a positioning apparatus and a second lifting apparatus, wherein the control apparatus is respectively connected to the positioning apparatus and the second lifting apparatus;

the second lifting apparatus is used to drive the platform storage to move in a third direction;

the control apparatus is used to, before the control apparatus controls the platform transmission mechanism to transport the testing platform assembled on the base to the second storage space, control the second lifting apparatus to drive the platform storage to move in the third direction until the positioning apparatus detects that the testing platform assembled on the base is aligned with the second storage space;

the control apparatus is also used to, before the platform transmission mechanism transports the standby testing platform stored in the first storage space to the base, control the second lifting apparatus to drive the platform storage to move in the third direction until the positioning apparatus detects that a position of the standby testing platform stored in the first storage space matches a position of the base.

9. A system for testing flatness, comprising: a material storage, a guide mechanism, and the device for testing flatness according to claim 1;

the material storage and the device for testing flatness are arranged around the guide mechanism;

the material storage is used to store a to-be-tested board, and the guide mechanism is used to take the to-be-tested board from the material storage and place them on the testing platform of the device for testing flatness.

10. The system for testing flatness according to claim 9, further comprising an adjustment mechanism, wherein the guide mechanism is disposed between the adjustment mechanism and the device for testing flatness;

the guide mechanism is also used to take a to-be-tested board from the material storage and place the to-be-tested board on the adjustment mechanism;

the adjustment mechanism is used to rotate the to-be-tested board so that a structure of the to-be-tested board is the same as the supporting structure of the testing platform in the same direction;

the guide mechanism is also used to pick up the adjusted to-be-tested board from the adjustment mechanism and place the to-be-tested board on the testing platform.

11. The flatness testing system according to claim 10, wherein the material storage is also used to perform a corrective operation on the to-be-tested board, so that the to-be-tested board is in a first designated position;

the adjustment mechanism is also used to perform a corrective operation on the to-be-tested board, so that the to-be-tested board is at a second designated position.

12. The system for testing flatness according to claim 9, wherein the device for testing flatness comprises a rotating shaft, a number M of said bases and M of said testing platforms, wherein the M bases are arranged around the rotating shaft, and the M bases are fixedly connected to the rotating shaft respectively, the M testing platforms are assembled on the M bases in a one-to-one correspondence, and the supporting structures of the M testing platforms are different; M is an integer greater than 1; and
 the to-be-tested board is placed on one of the M testing platforms which is facing the ranging sensor.

13. The system for testing flatness according to claim 9, wherein the device for testing flatness further comprises a driving mechanism, and the driving mechanism is disposed on a side of the testing platform away from the base, and the distance measurement The sensor is disposed on the driving mechanism, and the driving mechanism is used to drive the ranging sensor to move to the N to-be-tested positions respectively.

14. The system for testing flatness according to claim 13, wherein the driving mechanism comprises a first linear driving mechanism, a second linear driving mechanism, and a third linear driving mechanism, wherein the first linear driving mechanism extends in a first direction, the second linear driving mechanism extends in a second direction, the third linear driving mechanism extends in a third direction, the first direction intersects the second direction, and the third direction is perpendicular to the first direction and the second direction;
 the first linear driving mechanism is disposed on the second linear driving mechanism, and the second linear driving mechanism is used to drive the first linear driving mechanism to move along the second linear driving mechanism;
 the third linear driving mechanism is disposed on the first linear driving mechanism, and the first linear driving mechanism is used to drive the third linear driving mechanism to move along the first linear driving mechanism;
 the ranging sensor is disposed on the third linear driving mechanism, and the third linear driving mechanism is used to drive the ranging sensor to move along the third linear driving mechanism.

15. The system for testing flatness according to claim 9, wherein the testing platform is detachably assembled on the base, and the device for testing flatness further comprises a platform storage and a platform transmission mechanism;
 the platform storage comprises a first storage space and a second storage space, the first storage space is used to store a standby testing platform, and the second storage space is an empty storage space; the supporting structure of the standby testing platform is different from the supporting structure of the testing platform assembled on the base;
 the platform transmission mechanism is used to transport the testing platform assembled on the base to the second storage space, and transport the standby testing platform stored in the first storage space to the base.

16. The system for testing flatness according to claim 15, wherein the platform transmission mechanism comprises a plurality of first rollers, a plurality of second rollers, a plurality of third rollers, a plurality of fourth rollers, a first transmission belt, a second transmission belt, a third transmission belt, a fourth transmission belt, a fifth transmission belt, a sixth transmission belt, a first motor and a second motor;
 the base is disposed between the first transmission belt and the second transmission belt, and the platform storage is disposed between the third transmission belt and the fourth transmission belt;
 the first motor is used to drive the first transmission belt to rotate, and the second motor is used to drive the second transmission belt to rotate;
 the first transmission belt is used to drive the plurality of first rollers to roll, and the second transmission belt is used to drive the plurality of second rollers to roll;
 the fifth transmission belt is sleeved on one of the first rollers and one of the third rollers, and when the plurality of first rollers roll, the fifth transmission belt drives the plurality of third rollers to roll;
 the sixth transmission belt is sleeved on one of the second rollers and one of the fourth rollers, and when the plurality of second rollers roll, the sixth transmission belt drives the plurality of fourth rollers to roll;
 when the platform transmission mechanism transports the testing platform assembled on the base to the second storage space, the plurality of first rollers are disposed below the testing platform assembled on the base and in contact with the testing platform assembled on the base; the plurality of second rollers are disposed below the testing platform assembled on the base and in contact with the testing platform assembled on the base; and the plurality of third rollers and the plurality of fourth rollers are disposed below the second storage space; the first motor drives the first transmission belt to rotate; and the second motor drives the second transmission belt to rotate to drive the plurality of first rollers, the plurality of second rollers, the plurality of first rollers, and the plurality of fourth rollers rotate and transport the testing platform assembled on the base to the second storage space;
 when the platform transmission mechanism transports the standby testing platform stored in the first storage space to the base, the plurality of third rollers are disposed below the standby testing platform stored in the first storage space, and in contact with the standby testing platform stored in the first storage space; the plurality of fourth rollers are disposed below the standby testing platform stored in the first storage space, and in contact with the standby testing platform stored in the first storage space; the plurality of first rollers are aligned with the plurality of third rollers; the plurality of second rollers are aligned with the plurality of fourth rollers; the first motor drives the first transmission belt to rotate, and the second motor drive the second transmission belt to rotate to drive the plurality of first rollers, the plurality of second rollers, the plurality of third rollers, and the plurality of fourth rollers to rotate and transport the standby testing platform stored in the first storage space to the base.

17. The system for testing flatness according to claim 16, wherein the device for testing flatness further comprises a first lifting apparatus disposed below the base;
 before the platform transmission mechanism transports the testing platform assembled on the base to the second storage space, the first lifting apparatus is used to drive the base to move in a third direction, so that the plurality of first rollers are disposed below the testing platform assembled on the base and in contact with the testing platform assembled on the base, and the plurality of second rollers are disposed below the testing platform assembled on the base and in contact with the testing platform assembled on the base;

before the platform transmission mechanism transports the standby testing platform stored in the first storage space to the base, the first lifting apparatus is used to drive the base to move in the third direction until the platform transmission mechanism transports the standby testing platform stored in the first storage space to the base;

when the platform transmission mechanism is not working, the first lifting apparatus is used to drive the base to move in the third direction, so that the plurality of first rollers are disposed below the testing platform assembled on the base, and out of contact with the testing platform assembled on the base, and the plurality of second rollers are disposed below the testing platform assembled on the base, and out of contact with the testing platform assembled on the base.

18. The system for testing flatness according to claim 15, wherein the device for testing flatness further comprises a control apparatus, a positioning apparatus and a second lifting apparatus, wherein the control apparatus is respectively connected to the positioning apparatus and the second lifting apparatus;

the second lifting apparatus is used to drive the platform storage to move in a third direction;

the control apparatus is used to, before the control apparatus controls the platform transmission mechanism to transport the testing platform assembled on the base to the second storage space, control the second lifting apparatus to drive the platform storage to move in the third direction until the positioning apparatus detects that the testing platform assembled on the base is aligned with the second storage space;

the control apparatus is also used to, before the platform transmission mechanism transports the standby testing platform stored in the first storage space to the base, control the second lifting apparatus to drive the platform storage to move in the third direction until the positioning apparatus detects that a position of the standby testing platform stored in the first storage space matches a position of the base.

\* \* \* \* \*